Oct. 18, 1960

M. P. EHRLICH 2,957,155

ADJUSTABLE CONNECTOR FOR PRINTED CIRCUIT BOARDS AND THE LIKE

Filed June 14, 1956

2 Sheets-Sheet 1

INVENTOR.
MELVIN P. EHRLICH

BY Jerome Bauer

ATTORNEY

Oct. 18, 1960

M. P. EHRLICH
ADJUSTABLE CONNECTOR FOR PRINTED
CIRCUIT BOARDS AND THE LIKE 2,957,155

Filed June 14, 1956

2 Sheets-Sheet 2

INVENTOR.
MELVIN P. EHRLICH
BY
Jerome Bauer
ATTORNEY

United States Patent Office 2,957,155

Patented Oct. 18, 1960

2,957,155

ADJUSTABLE CONNECTOR FOR PRINTED CIRCUIT BOARDS AND THE LIKE

Melvin P. Ehrlich, Brooklyn, N.Y., assignor to Nuclear Research Associates, Inc., Washington, D.C., a corporation of Delaware Filed June 14, 1956, Ser. No. 591,362

12 Claims. (Cl. 339—17)

Figures 1, 2, 3:
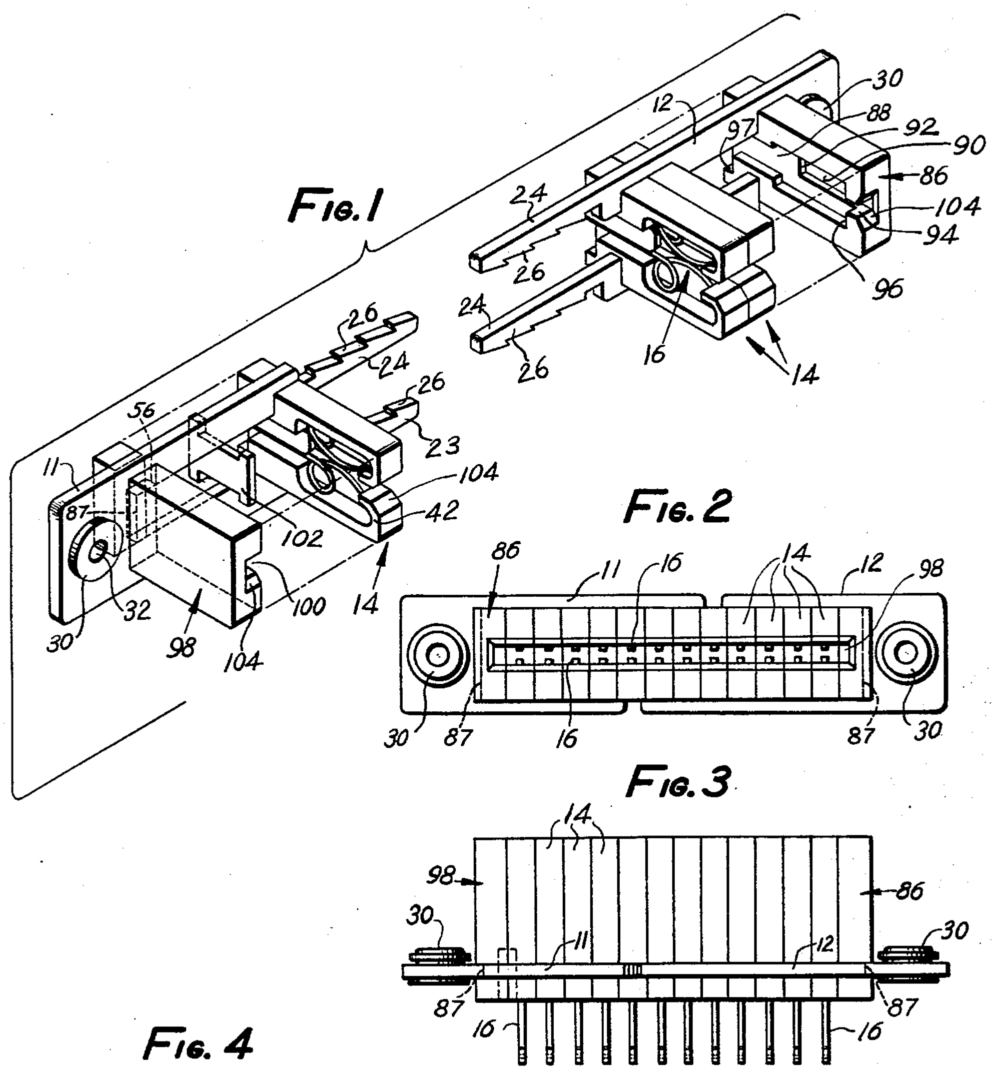

This invention relates to an adjustable electrical connector and more specifically is intended to be used with printed electrical circuits whereby the total number of connector elements may be varied to accommodate any desired number of electrical circuits provided.

Advancements in the electrical and electronic fields has resulted in the adaptation of printed circuits in place of conventional wiring circuits which are tedious to install, expensive and not easily suited for mass production techniques. Printed circuits constitute a reasonable solution of this problem. Once a printed electrical circuit is processed on an insulated card or board and the master circuit has been made, thousands of duplicate circuits can then be run off. These printed circuits are then connected either to other printed circuits or to conventional wire circuits as the electronic system may require.

In order to interconnect the circuits, spring connectors are used. Heretofore, the spring connectors were composed of a plurality of stiff, tough spring members that were fixed in position relative to each other on a dielectric base. Through usage it has become the accepted practice to fixedly mount only certain selected multiples of such connectors on the dielectric board and at pre-selected relative spacings. As a consequence the format of the printed circuits, their permissible number and relative spacings have been limited and controlled by the capacity and limitations of the electrical connectors that are employed therewith.

Until the present invention was devised, no method or apparatus to allow adjustment was known. Thus, if a new format of printed circuit was necessary to be connected, an entirely new spring connector arrangement had to be provided. These deficiencies in the prior art have been overcome by the instant novel adjustable connector. Here, wire connectors and module blocks are supplied for a given printed circuit, and when a different arrangement of printed circuits is to be used, some module blocks may be removed, or added, as the case may be, to accommodate the new circuits. In addition, it is possible to utilize both sides of a printed circuit card.

A primary object of the invention is to permit the expansion and adjustment of circuit connectors in order to enable any desired number of electrical contacts to be utilized as required to make circuit connection with circuits printed on either side of a printed circuit board.

Another object is to provide a circuit connector means whereby low contact pressure between the card and connector prevents scoring of the circuit pattern when the invention is in use.

Still another object is to provide a circuit connector whereby the connector elements thereof may be assembled or disassembled easily by a technician for minimum loss of repair time when there is operational failure or adapt the same to a different circuit format.

It is a further object to provide a series of module blocks that support each other in predetermined spaced relation while concurrently receiving and retaining current connector wires therein in immobile positions.

It is a still further object to provide current connector means that are resilient and yet have the necessary resistance to permanent deformation to make constant contact with the printed circuit terminals, even after repeated applications and extended periods of use.

And yet another object is to provide resilient wires adapted to seat snugly into a module block connector whereby the contact tolerates wide variations in the circuit card construction while the contact is retained rigidly in the connector, thereby preventing the cold working of soldered cable connections.

A feature of the invention resides in the spring design whereby selection of a wire wrap or a solder termination connection may be made by the technician.

Another important object is to provide an end locking structure designed to correct for accumulated variations in tolerances of individual circuit connector members while providing required locking force to hold the circuit connector members in position.

Another object is to provide a method whereby any selected number of circuits printed on a board could be connected to a further external circuit, the connections being variable according to the printed circuit that one desires to use at the time.

And another object is to maintain electrical contact at all times, despite variations in the thickness of a printed circuit board due to either design or warpage.

Figure 4:
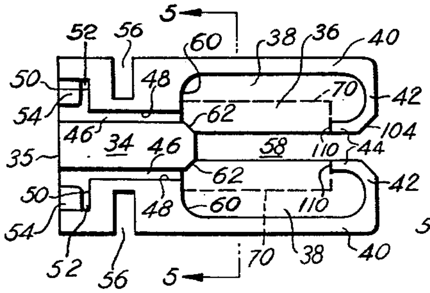
Figure 5:
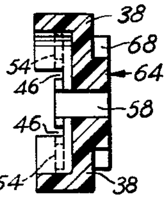
Figure 6:
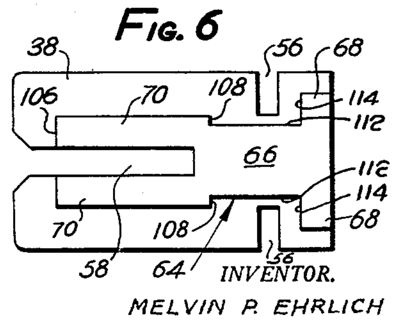
Figures 7, 8:
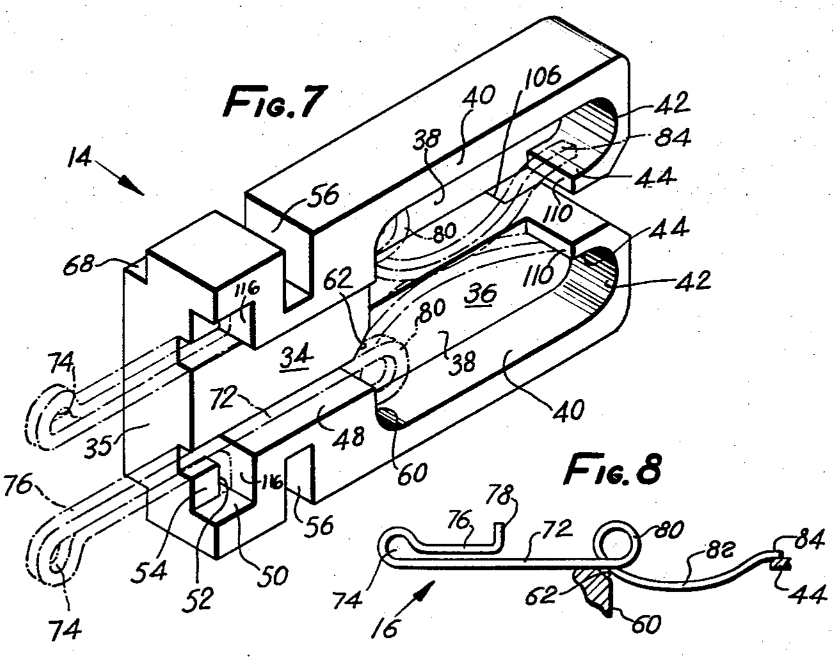
Figure 9:
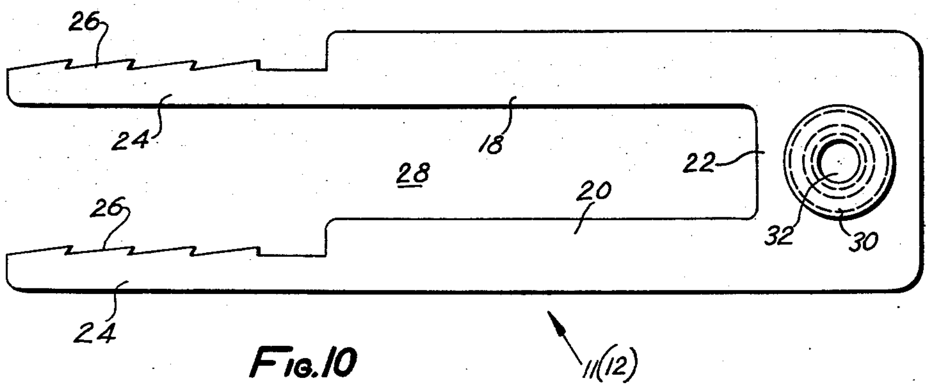
Figure 10:
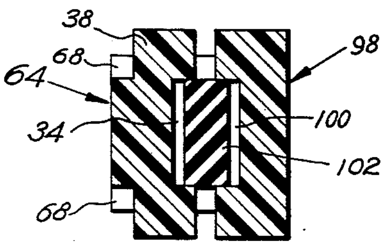

Other and further objects of my invention reside in the structures and arrangements hereinafter more fully described with reference to the accompanying drawings in which:

Fig. 1 is an exploded view, illustrating in perspective a preferred embodiment of the adjustable electrical circuit connector, Fig. 2 is a plan view of the invention in assembled form, Fig. 3 is a side elevational view of the invention, Fig. 4 is a front elevational view of a module block used to retain the wire connectors, Fig. 5 is a section taken on line 5—5 of Fig. 4, Fig. 6 is a rear elevational view of the module block of Fig. 3, Fig. 7 is a perspective view of a module block with the wire connector shown in silhouette, Fig. 8 repersents a wire connector per se, Fig. 9 is a side elevation of one of the module housing members, and Fig. 10 is a sectional view of an end block and resilient insert, illustrated in relation to the adjacent module block.

As is clearly illustrated in Fig. 1, the adjustable printed circuit connector of the invention includes housing members 11 and 12, each housing member being constructed to frame or support and retain removably thereon the connector module blocks 14. Retained within each of the module blocks 14 is a wire circuit connector specially designed, as will presently appear.

Referring to Figs. 1, 2, 3 and 9, the construction of the connector housing member 11 includes a pair of spaced apart legs 18 and 20, connected by crosspiece 22 at one end to form a U-shaped housing member 11. The legs 18 and 20 continue as extension legs 24 with the notched portions or locking surfaces 26 in the same plane as the housing legs 24 to define a housing space 28. The notches 26 on each leg are in the form of one-way engaging ratchet teeth, and face in the same direction.

Housing members 11 and 12 are of exactly the same construction. However, when in use the member 12 is positioned mirror-hand of member 11 and rotated about a longitudinal axis so that its teeth 26 face down in a direction to interlock with those of member 11. It is thus readily apparent that when the housing members 11 and 12 in Fig. 1 are moved toward each other, their respective cooperating teeth 24 mesh and lock together to form a unitary locking means or adjustable housing for the module blocks 14.

With the required number of module blocks mounted in space 28 between the leg members, the extension legs 24 are moved toward each other, enabling the ratchet teeth 26 to engage and lock the module blocks in position, as is shown in Figs. 2 and 3.

Provided in the connecting leg 22 is a bushing 30 having an aperture or hole 32. Any suitable fastening means may extend through the aperture 32, allowing the adjustable module housing to be secured on a permanent support not shown.

Any desired number of module blocks 14 may be securely mounted in the complete housing formed by the interlocking members 11 and 12. When so mounted the module blocks are adapted to securely receive, engage and make connection with at least an electrical circuit printed on a circuit card or board (not shown).

The specific construction of the module block 14 is disclosed in detail in Figs. 4, 5, 6 and 7. Each block 14 comprises a shallow recess 34 which extends from the rear 35 thereof to join with a deep recess 36 extending to the front of the same. Recess 36 is of generally greater length and depth than the shallow recess 34 and, by means of a back wall 38, side or extension walls 40 and lip means 42 it provides a receptacle housing for the forward portion of wire connectors 16, as will presently be explained.

Lip means 42 include the flanges 44 which are each turned inwardly toward the shallow recess 34. The longitudinally extending grooves 46 (Fig. 5) on each side of recess 34, are cut into the back wall 38 along the length of the shallow recess 34. Resulting supporting ledges 48, on each side of recess 34, provide rigid supporting surfaces for both the wire connectors 16 and adjacent module blocks 14.

In addition, extending from the rear of each module block 14 is an L-shaped space 50 having a transversely directed slit 52 to assist in supporting the wire connectors 16 from longitudinal movement in their respective module blocks 14. Resulting transverse stops 54 may limit relative transverse movement of juxtaposed module blocks 14.

Module blocks 14 are slidably mounted in the adjustable connector housing 11, 12 along the legs 24 thereof by way of transverse slots 56 provided therein as is shown in Fig. 1. The two slots 56 in each module block 14 are of such depth that the distance between the bases thereof is substantially equal to the height of housing space 28. Thus when the two housing members 11 and 12 are moved toward each other their ratchet teeth 26 are guidingly forced into locked engagement.

An axial opening 58 extends from the front of each module block 14, along the length of recess 36 and terminates at recess 34. The extensions 40 terminate at internal edges 60 while the forward portions of recess 34 are beveled or chamfered at 62. An I-shaped projection or extension 64 formed integral with or attached to the rear of the wall 38 of each module block 14 is also axially slotted to jointly form the slot 58. Extension 64 includes a central section 66 that is adapted to fit into the shallow recess 34 of an adjacent block 14 while a pair of lateral arms 68 fit into the L-shaped space or recess 50, and a pair of arms 70 nestle in recess 36, as is indicated by the dotted lines shown in Fig. 4. The nestling fit of the projections of extension 64 of one module block 14 into the respective recesses of the next adjacent module block 14 serves to obviate any relative movement between the two nestling blocks.

Securely, yet flexibly seated within each module block 14 are two electrical wire connectors 16 of identical construction (see Fig. 7) to make contact with circuits printed on both sides of a board or card. Wire 16, being of spring material, provides resilient freedom of movement and is so designed as to avoid strain at all times. Each wire 16 comprises a strand 72 of square cross-section that seats in the groove 46 and extends beyond the rear edge 35 of its respective module block 14. Strand 72 forms a loop 74 at its exposed extremity and doubles back into its module block 14 along a parallel section 76. The use of square cross-section wire rather than the broad flat spring provides for a long leakage path and low intercontact capacitance. This has proven to enhance its application to high frequency equipment.

Parallel section 76 is closely spaced from the strand section 72 (Fig. 8) and has a hook means 78 that extends transversely into slit 52. When hook 78 is seated in its slit 52 the parallel strands 72 and 76 are then placed into an abutting relationship along their lengths. The other end of strand section 72 continues in a deformation in the form of a loop or coil 80 and extends into a contiguous flatly arched portion 82. The arched portion 82 terminates in an extension means 84 that seats on the internal surface of flange 44. The flat arc or contact portion 82 enables large area contact with the printed circuit to provide low contact resistance while the loop 80 defines structure whereby deforming stresses applied at the contact area will be absorbed.

One of the novel features of the invention that distinguishes it from prior art devices resides in that the bending or deforming stresses applied to the arched portion 82 of spring 16 are transmitted to the co-extensive coil 80 and absorbed thereby. Hence, continuous use and wide range of movement of the arched portion 82 results in absorption of the stresses applied thereto by the coil 80.

Since the working length of the spring 16 is materially increased by the provision of the coil 80, and the stresses applied along the arched portion 82 are absorbed by deforming the coil, unit stress is therefore well below the elastic limit of the spring material that is employed. This enables the use of a spring material that is more malleable, less brittle, more easily worked into the desired form and also inexpensive. The flat arc or contact portion 82 enables large area contact with the printed circuit to provide low contact resistance while the loop 80 obviates the normally high contact pressure provided thereat.

Serving the dual function of assisting in holding the module blocks 14 in alignment against relative movement when a plurality of them are assembled in a nestling relationship, and also providing means to compensate for tolerance variations between the assembled module blocks is an end or capping block structure 86. Each capping block 86 of the capping structure (Figs. 1, 2, 3 and 10) is provided with a shallow recess 88 and a deep recess 90, separated by means of a shoulder 92 (see Fig. 1). A lip 94, having a recess shoulder 96 and a cut-out section 97, is complementary to the portions of the projection 64 to receive the same snugly therein and into recess 88. The shoulders defining the recesses 96 and 97 accommodate arms 68 and 70 of the adjacent block 14, while transverse relative movement therebetween is prevented by the rear wall of the recess 88 of the capping block 86.

Capping block 98, on the other end of the module block assembly is exactly the same in form as capping block 86. It is provided with a recess 100 (see Fig. 10) that faces the substantially complementary recesses 34, 36 and 50 of the facing adjacent block 14 and is adapted to receive therein an I-shaped rubber insert 102.

The rubber insert 102 interconnects and secures together the capping block 98 with the next adjacent module block 14 by snugly fitting within the corresponding facing recesses of each. When so positioned in the recesses to interlock the two blocks, the insert 102 cooperates with the walls or shoulders of such recesses to limit relative lateral or tilting movement between the two blocks. However, because insert 102 is resilient it may be compressed to permit relative transverse adjustment or spacing between the capping block 98 and the adjacent block 14. Hence cumulative tolerance variations in transverse thicknesses of the assembled plurality of module blocks 14 are compensated by the yielding compressible nature of insert 102.

Transverse slots (not numbered), similar to slots 56 in module blocks 14, are provided in the capping blocks 86 and 98 to permit their transverse movement along legs 24 and for retention in the housing members 11 and 12. Both the capping blocks 86 and 98 and the module blocks 14 are chamfered at 104 to guidingly receive the edges of a printed circuit card or board (not shown) in their respective axial recesses 90 and slots 58 respectively.

The assembly of the adjustable connector of the invention is readily apparent from the foregoing description. When the circuits of a printed circuit board are to be interconnected to a set of circuits on another board, the connector of the invention may be assembled, or if assembled already, varied or adjusted in size to contain module connectors 14 equal to the number of circuits in each set that are to be interconnected.

Knowing the number of circuits contained on a printed circuit board, the clothespin housing members 11 and 12 are separated from each other at 26. The required number of module blocks 14 are then slipped in the space 28 between the legs 24 at slots 56 and moved transversely therealong to be securely retained on and between the housing leg members 18 and 20. Because of the close tolerance between the sides of the slots 56 and the housing leg members, unwarranted relative oscillating motion is obviated.

Module blocks 14 are prepared for use by inserting wire connectors 16, one in each groove 46. Strand 72 is seated in groove 46 and is supported therein along the length of ledge member 48. Coil 80 is freely located in recess 36 to coil and uncoil free of abutment with shoulder 62 or internal shoulder 60 of extension wall 40. The arched section 82 of wire connector 16 extends or protrudes into the axial opening 58, with an extension tip 84 seated on flange 44 of lip means 42. With the extension tip 84 terminating against the inner surface of lip means 42 the coil 80 is placed under sufficient tension to constantly urge the contiguous contact arc 82 into the path of slot 58, to insure its constant engagement with the surface of the circuit printed on a board or card.

Seated thus, connector loop 74 extends beyond the rear of its module block 14 and is restrained from longitudinal displacement by its hook 78 that is held in slit 52. It is thus evident that when connection is being made with a circuit printed on a board as the board is inserted in the slots 58 and recesses 90 and 100 to the depth thereof, as limited by shoulder 92, there is little opportunity for wire connector 16 to be displaced longitudinally.

The provision of extended parallel sections 72 and 76, together with loop 74 greatly facilitates wire connections. The broad flat surface presented by the two parallel sections 72 and 76 extending behind the module block is of such size as to be easily adapted for use as wrap-type connectors about which conductor wires may be wrapped mechanically. This permits the technician simply to wrap the end of an electrical wire conductor around it. On the other hand, if a solder connection is desired, the free end of a conductor wire may be slipped through loop 74, solder is applied, and a permanent connection is quickly provided.

Transverse movement of the electrical wire connectors 16 within their module blocks 14 is prevented by the wall construction of the module blocks themselves and the abutting extension 64. As will have been noted from the construction of extension means 64, arms 70 seat in recess 36 with the free ends 106 thereof being slightly spaced from engagement with shoulders 110. Shoulders 108 thereof abut firmly against internal edges 60 of extension 40, while shoulders 112 extend transversely into shallow recess 34 to seat along ledges 48 thereof, and shoulders 114 abut the forward wall 116 (Fig. 7) of space 50. Mid-section 66 is thus nested into recess 34 with its lateral arms 68 seated in space 50 engaging against stop 54 to prevent lateral movement of the strands 72 and 76 while coil 80 and contact portion 82, although locked transversely in position, are permitted to deform unhampered.

When so nested in position adjacent blocks 14 and capping block 86 are locked together into a composite assembly. The two wall cooperations at 108 with 60 and 114 with 116, serve to lock the blocks one to the other against relative longitudinal movement. The third set of wall cooperation at 112 with 48 serves to lock the blocks 14 and 86 against relative lateral movement.

With the required number of module blocks 14 nested into position in the housing formed by the combination of housing members 11 and 12, extension legs 24 are slid together until all of the module blocks are moved toward each other and locked nested together. The ratchet means 26, guided by slots 56, provide the locking engaging means between the two housing sections 11 and 12 to form a unitary housing structure. To separate the housing members 11 and 12, the ratchet locking legs 24 are sprung apart slightly in any desired manner to release the engaging teeth 26. The housing members 11 and 12 are then drawn apart and separated from each other to enable the addition or subtraction of blocks 14 in the clothespin type housing.

Once the desired number of blocks 14 are positioned in the space 28 the members 11 and 12 may be moved back into locking cooperation along their legs 24 at 26. The number of module blocks 14 that may thus be assembled in the housing 11, 12 is therefore limited only by the capacity of the housing while it will be readily recognized that the housings may be provided in various desirable combinations of sizes. Thus any number of module blocks 14 and connectors 16 may be provided to make connection with the circuits on either side of a printed circuit board.

The assembly is completed by the capping blocks 86 and 98 that are positioned at each end of the assembled module blocks 14 nested in housing 11, 12. Positioned between and cooperating with the capping block 98 and the adjacent module block 14 to secure them together is the insert 102 that serves to compensate for variations that might occur in the width of each module block during their molding and in the consequent accumulated variations in width in the total assembly of such blocks within the housing. To provide a more complete locking, the caps 86 and 98 may be provided with slots 87 that extend laterally across their backs between and interconnecting the slots 56. Such additional slots each may accommodate the crosspieces 22 therein.

It should be noted that prior to the instant invention, and particularly in fixed connector devices, it was not possible to reliably utilize individually, circuits that were printed on opposite sides of a board. With the module block structure of the instant invention and the upper and lower spring wire connectors 16 included therein, it is now possible to engage, for individual use, circuits printed on both sides of the printed circuit card. The result is a reliable connector assembly of module construction that permits service of two separate sets of circuits printed on opposed sides of a single board. Therefore, if a printed circuit card were supplied with one set of electrical circuits on one side thereof and another set on the other side, it would be a simple matter to make connection with the same by way of the opposed upper and lower spaced connectors 16.

While there have been shown and described and pointed out the fundamental novel features of the invention as applied to a preferred embodiment thereof, it will be understood that various omissions and substitutions and changes in the form and details of the device illustrated and in its operation may be made by those skilled in the art, without departing from the spirit of the invention. It is the intention, therefore, to be limited only as indicated by the scope of the claims appended hereto.

I claim:

1. An electrical connector assembly comprising opposed housing members, legs on said housing members, said legs having engaging means thereon for cooperative engagement between said opposed housing members, a plurality of module blocks positioned within said housing members, an elongated slot in each module block, lip means on each block inturned along said slot, elongated grooves in said module blocks, and tensioned wire connectors seated in said grooves terminating against said lip means to tension the connector.

2. An electrical connector assembly as in claim 1, said module blocks each having recessed portions and extension means, said extension means being able to be nested in the recessed portion of an adjacent module block, said wire connectors being restrained against unseating from their respective groove by the adjacent extension means nested in the recessed portion of their respective module block.

3. An electrical circuit connector comprising a module block, parallel extension means on said block, said extension means providing space therebetween, inturned lip means on said extension means, a wire connector retained in said module block, said wire connector extending beyond the module block at one end thereof and extending into and terminating against said inturned lip means at the other end thereof, said wire connector having a coil and an arc section in said space to resiliently complete an electrical circuit with a circuit board placed therewithin.

4. In an electrical connector for independent circuit engagement with individual printed circuits printed on opposite sides of a board, said electrical connector comprising a pair of spaced opposed independent connector elements, said connector elements each having a deformable coil and a coextensive arched portion, a member in which said pair of elements are retained in said spaced opposition whereby a printed circuit board having circuits printed on opposite sides thereof may be inserted in said space between said opposed connector elements to engage independently the circuits printed thereon with said arched portions of said elements, and means on each of said elements to connect the same to a further circuit.

5. In an electrical circuit connector assembly for a board having a plurality of printed circuits thereon, a plurality of connector members, one for each of the circuits printed on said board, each of said members having an opening in which said board and one of said circuits thereon may be received, a connector element in each member having an arched contact extending into said opening for circuit engagement with the circuit in said opening, a portion extending beyond said connector member and a deformable coiled portion contiguous with said arched contact, and means cooperable with each of said connector members to secure the same in nested relationship with their openings in alignment.

6. In an electrical circuit connector assembly for a printed circuit board and in which there are a plurality of connector blocks each including a connector element having a deformable coil and an arched contact surface for electrical connection with the circuits on said board, a housing to secure said blocks in nested aligned relationship including a plurality of like housing members, said housing members each having a pair of spaced legs, engagement means on said legs cooperable to secure said housing members together, and said blocks having slots to slidably receive said legs to guide said engagement means into securing cooperation.

7. In an electrical connector assembly, a housing including opposed housing members, spaced legs on each of said members defining an open-ended entranceway, said legs having releasable engagement means thereon for engagement and relative adjustment of said opposed housing members to define an adjustable housing space and unitary locking means, said housing space being variable in accordance with the relative adjustment of said members, and a plurality of connector blocks slidable along said legs for selective insertion and removal from said housing space by way of said entranceway and retained in said space by the relative adjustment of said housing members tightly against said blocks and the cooperation of said engagement means.

8. In an electrical connector assembly having a plurality of nested connector blocks, said blocks each having an opening extending longitudinally therein, said openings being aligned to simultaneously receive a board having circuits printed thereon, a housing to releasably lock said nested blocks together including mirror-hand members having interlocking means cooperable to form an adjustable releasable unitary lock, means defined on said blocks to slidably mount the same on said members, and means on said members to move said blocks into nested relationship, said interlocking means being adjustable to secure said members together to retain a selectively variable number of said blocks in their nested relationship and operable to release said members to enable the removal and insertion of selected blocks for circuit engagement with selected ones of said circuits on said board.

9. In an electrical circuit connector for a board having circuits printed thereon, a connector block having an axial opening to receive a printed circuit board therein and laterally extending recesses having access to opposite sides of said opening, independent electrical connectors in each of said recesses having a contact portion extending from said recesses into said opening each from opposite sides thereof to provide a large portion of contact with the circuit on said board received in said opening, and deformable coil means on said connectors intermediate the ends thereof and positioned in said recesses free of the walls thereof to deform unhampered to absorb stresses applied by said board to said contact portions.

10. In an electrical circuit connector for connection with circuits on a printed circuit board, a module block having an axial opening and guide means to guide said board for reception in said opening, at least a recess in said block having access to said opening, an electrical connector having continuous coiled stress absorption and arched contact means in said recess, said contact means extending from said recess into said opening, and said stress absorption means being positioned in said recesses free of the walls thereof and means on said module block cooperating with said connector to pre-stress said stress absorption means.

11. In an electrical connector for circuits printed on a board, a plurality of module blocks each having an axial opening and guide means to guide said board for reception in the openings thereof, said blocks each having at least a recess with access to said opening, an electrical connector in said recess having coiled stress absorption means and contact means freely positioned in said recess, said contact means extending from said recess into said opening for engagement with the circuit on the board received in said opening, means on said module block cooperaing with said connector to pre-stress said stress absorption means and housing means cooperating with each of said plurality of module blocks to secure the same together.

12. In an electrical connector for a board having an electric circuit printed thereon, a connector block, said connector block having an axially extending opening for the reception of said board, a connector element extending into said opening, said connector element including an arched surface having a large area of contact for electrical circuit engagement with said circuit on said board when the same is received in said opening and contiguous deformable coil means on said connector element freely positioned in said block for free uninterrupted deformation to absorb forces applied to said surface, said connector block having transverse slots on opposite sides thereof, and a housing having a pair of spaced legs cooperable with the walls of said slots to mount said connector board in said housing.

References Cited in the file of this patent

UNITED STATES PATENTS

| | | |
|---|---|---|
| 1,880,952 | Fabrey | Oct. 4, 1932 |
| 2,046,778 | Godare | July 7, 1936 |
| 2,087,538 | Godare | July 20, 1937 |
| 2,131,066 | Obermaier | Sept. 27, 1938 |
| 2,269,135 | Tate | Jan. 6, 1942 |
| 2,465,039 | Reynolds | Mar. 22, 1949 |
| 2,657,372 | Mowers | Oct. 27, 1953 |
| 2,665,100 | Jason | Jan. 5, 1954 |
| 2,690,546 | Ostrak | Sept. 28, 1954 |
| 2,699,534 | Klostermann | Jan. 11, 1955 |
| 2,701,346 | Powell | Feb. 1, 1955 |
| 2,765,450 | Richardson | Oct. 2, 1956 |
| 2,780,791 | Morschel | Feb. 5, 1957 |

FOREIGN PATENTS

| | | |
|---|---|---|
| 208,628 | Switzerland | Feb. 15, 1940 |
| 672,066 | Germany | Feb. 21, 1939 |
| 725,032 | Great Britain | Mar. 2, 1955 |
| 872,768 | France | Feb. 23, 1942 |
| 931,803 | France | Nov. 3, 1947 |
| 1,040,024 | France | May 20, 1953 |